United States Patent
Shibuya

(10) Patent No.: US 6,586,981 B2
(45) Date of Patent: Jul. 1, 2003

(54) DYNAMIC FLIP FLOP

(75) Inventor: Yoshihiro Shibuya, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/017,247

(22) Filed: Dec. 13, 2001

(65) Prior Publication Data

US 2002/0093369 A1 Jul. 18, 2002

(51) Int. Cl.$^7$ ............................................. H03K 3/289
(52) U.S. Cl. ...................... 327/203; 327/211; 327/202; 326/113
(58) Field of Search ............................ 326/95, 93, 98, 326/113; 327/200–203, 208, 212, 218

(56) References Cited

U.S. PATENT DOCUMENTS 4,554,467 A * 11/1985 Vaughn ...................... 307/279
4,691,122 A * 9/1987 Schnizlein et al. .......... 307/279
5,569,390 A * 10/1996 Endo ........................ 250/208.1
5,998,779 A * 12/1999 Kozuka ..................... 250/208.1
6,064,246 A * 5/2000 Endo et al. ................. 327/202
6,133,565 A * 10/2000 Fujimoto et al. ........... 250/234

* cited by examiner

Primary Examiner—Michael Tokar
Assistant Examiner—Vibol Tan
(74) Attorney, Agent, or Firm—Adams & Wilks

(57) ABSTRACT

It is intended to provide a dynamic flip flop that prevents a floating signal from maintaining a voltage below a substrate voltage level in a P-type semiconductor substrate and that prevents a floating signal from maintaining a voltage exceeding the substrate voltage level in an N-type semiconductor substrate. In the dynamic flip flop, an N-type MOSFET (5) controlled by an output signal MX from an inverter (2) and an N-type MOSFET (6) controlled by an output signal Q from an inverter (4) are provided as switches for short-circuiting a signal M and a signal QX to be brought into a floating state to a substrate.

29 Claims, 4 Drawing Sheets

DYNAMIC FLIP FLOP

BACKGROUND OF THE INVENTION

1. Field of the Invention

The present invention relates generally to a dynamic flip flop that, at points of variation in clocks, prevents a signal line to be brought into a floating state from maintaining a voltage below a substrate voltage level when using a P-type semiconductor substrate and prevents a signal line to be brought into a floating state from maintaining a voltage exceeding a substrate voltage level when using an N-type semiconductor substrate.

2. Related Background Art

FIG. 7 shows an example of a circuit diagram illustrating a dynamic flip flop conventionally used. As shown in FIG. 7, a dynamic flip flop has been known that is composed of a transmission gate 101, an inverter 102, a transmission gate 103, and an inverter 104. The transmission gate 101, into which a signal D is input, outputs a signal M in synchronization with a clock C1 and a clock C1X. The inverter 102 inverts the signal M to output a signal MX. The transmission gate 103, into which the signal MX is input, outputs a signal QX in synchronization with a clock C2 and a clock C2X. The inverter 104 inverts the signal QX to output a signal Q. FIG. 8 shows a diagram illustrating an operation of the dynamic flip flop conventionally used.

In such a dynamic flip flop, however, when the conduction in the transmission gate 101 ceases according to timing of the clock C1, the signal M is brought into a floating state. When the transmission gate 101 is in a conducting state and the signal M is at a substrate voltage level, the signal M maintains a voltage below the substrate voltage level due to coupling caused by parasitic capacitance generated between the clock C1 and the signal M at the instant when the conduction in the transmission gate 101 ceases. Similarly, when the conduction in the transmission gate 103 ceases according to timing of the clock C2X, the signal M is brought into a floating state. When the transmission gate 103 is in a conducting state and the signal M is at a substrate voltage level, the signal QX maintains a voltage below the substrate voltage level due to coupling caused by parasitic capacitance generated between the clock C2X and the signal QX at the instant when the conduction in the transmission gate 103 ceases. When using a P-type substrate, a PN junction diode between the substrate and a drain with a voltage below the substrate voltage level is subjected to a forward bias and a substrate current flows. When the substrate current flows, electrons are generated. The electrons thus generated are minority carriers in the P-type substrate and become stray carriers. The stray carriers diffuse inside the semiconductor substrate. For example, in a semiconductor device having a built-in light-receiving element such as a photoelectric conversion device, there has been a problem of causing fixed pattern noise since electrons as stray carriers contaminate the light-receiving element and the degree of contamination is not uniform over the whole light-receiving element.

SUMMARY OF THE INVENTION

A dynamic flip flop of the present invention is characterized by being provided with switches for short-circuiting signal lines to be brought into a floating state to the substrate side according to timing of clocks.

DETAILED DESCRIPTION OF THE PREFERRED EMBODIMENTS

A shift register according to the present invention is provided with switches for short-circuiting signal lines to be brought into a floating state to the substrate side according to timing of clocks. This allows retention of a voltage below a substrate voltage level to be eliminated in a p-type semiconductor substrate. Similarly, retention of a voltage exceeding a substrate voltage level can be eliminated in an N-type semiconductor substrate.

Embodiment 1

Figure 1:
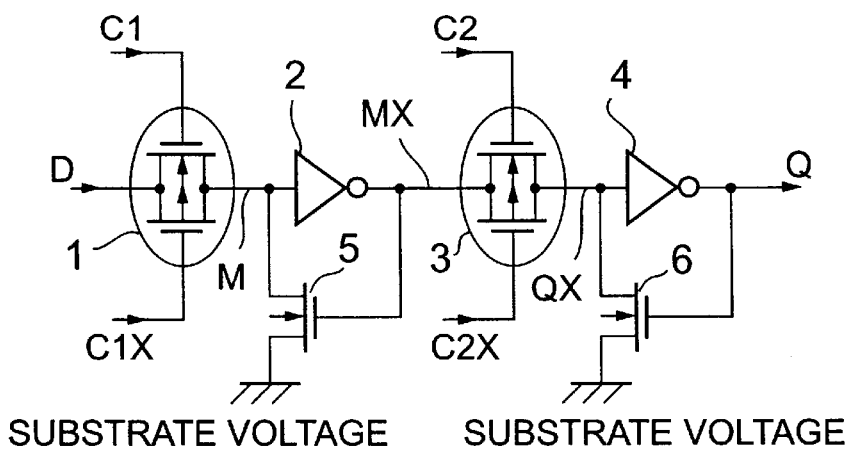
FIG. 1 is a circuit diagram showing a dynamic flip flop according to Embodiment 1 of the present invention.
Figure 2:
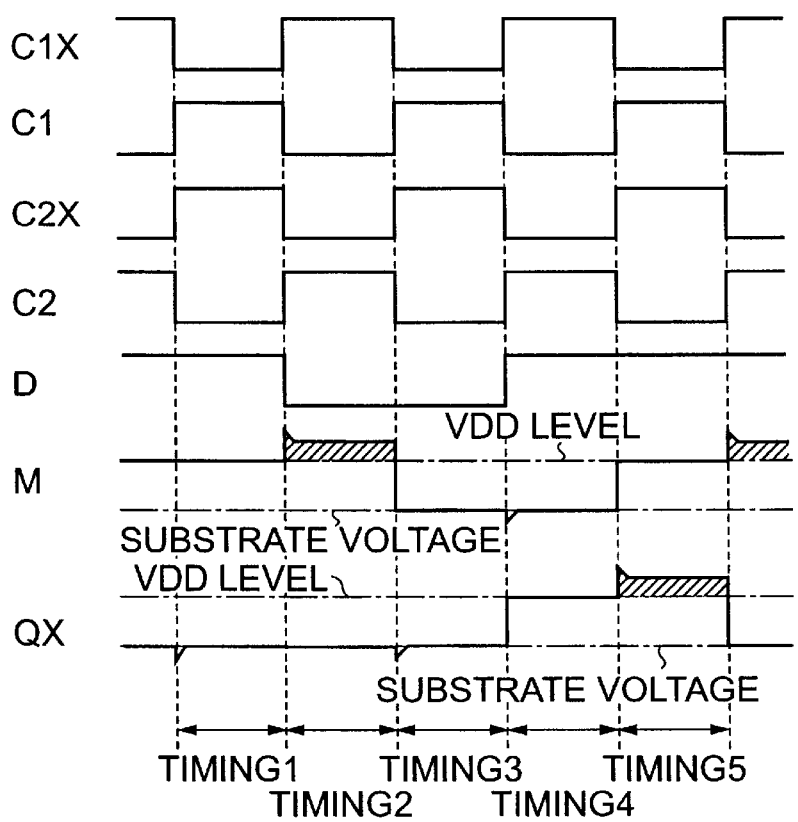
FIG. 2 is a timing chart as to the dynamic flip flop according to Embodiment 1 of the present invention.

FIG. 1 is a circuit diagram showing a dynamic flip flop according to Embodiment 1 of the present invention. FIG. 2 shows an example of timing in respective signal lines in Embodiment 1 of the present invention. When a P-type semiconductor substrate is used, a drain of an N-type MOSFET in a transmission gate 1 is connected to a drain of a P-type MOSFET in the transmission gate 1. A source of the N-type MOSFET in the transmission gate 1 is connected to a source of the P-type MOSFET in the transmission gate 1. Thus, the transmission gate 1 is configured. A clock C1 is input to a gate of the N-type MOSFET in the transmission gate 1. An inverted signal C1X of the clock C1 is input to a gate of the P-type MOSFET in the transmission gate 1. The transmission gate 1 outputs a signal M converted from a signal D input thereinto when the clock C1 reaches a VDD level and the clock C1X reaches a substrate voltage level. An inverter 2, a drain of an N-type MOSFET in a transmission gate 3, and a drain of a P-type MOSFET in the transmission gate 3 are connected to one another. The inverter 2, into which the signal M as an output signal from the transmission gate 1 is input, inverts the signal M to output a signal MX. A source of the N-type MOSFET in the transmission gate 3 is connected to a source of the P-type MOSFET in the transmission gate 3. Thus, the transmission gate 3 is configured. A clock C2 is input to a gate of the N-type MOSFET in the transmission gate 3 and an inverted signal C2X of the clock C2 is input to a gate of the P-type MOSFET in the transmission gate 3.

The transmission gate 3 outputs a signal QX converted from the signal MX when the clock C2 and the clock C2X reach the VDD level and the substrate voltage level, respectively. In order to eliminate retention of a voltage below the substrate voltage level, which is a characteristic of the present invention, and thus to suppress the generation of minority carriers to a minimum, an N-type MOSFET 5 and an N-type MOSFET 6 are added to a dynamic flip flop of a conventional technique including an inverter 4, into which the signal QX as an output signal from the transmission gate 3 is input, that inverts the signal QX to output a signal Q. In the N-type MOSFET 5, the signal MX as an output signal from the inverter 2 is input to its gate, its source is connected to the substrate voltage level, and its drain is connected to the signal M. In the N-type MOSFET 6, the signal Q as an output signal from the inverter 4 is input to its gate, its source is connected to the substrate voltage level, and its drain is connected to the signal QX. For convenience of the invention, the transmission gate 1 and the transmission gate 3 are described as transmission gates. Instead of the transmission gates, however, P-type MOSFETs or N-type MOSFETs alone may be included. Furthermore, it is possible to eliminate the retention of a voltage below the substrate voltage level, which is a characteristic of the present invention, even when the clock C1 and the clock C2X are subjected to common connection and the clock C1X and the clock C2 also are subjected to common connection.

FIG. 2 shows an example of timing in the respective signal lines. When the clock C2 falls and the clock C2X rises in timing 1 and timing 3, the conduction in the transmission gate 3 ceases. Until the conduction in the transmission gate 3 ceases, an output at the substrate voltage level from the inverter 2 is supplied to the signal QX. When the conduction in the transmission gate 3 ceases, the signal QX is not brought into a floating state but is maintained at the substrate voltage level by the N-type MOSFET 6 as a switch for short-circuiting the signal line to the substrate side, which is a characteristic of the present invention. Since the signal QX is maintained at the substrate voltage level, the signal QX is prevented from maintaining a voltage below the substrate voltage level through the coupling caused by parasitic capacitance generated between the clock C2 and the signal QX at the instant when the conduction in the transmission gate 3 ceases. Similarly, when the clock C1 falls and the clock C1X rises in timing 4, the conduction in the transmission gate 1 ceases. Until the conduction in the transmission gate 1 ceases, an input at the substrate voltage level of the signal D is supplied to the signal M. When the conduction in the transmission gate 1 ceases, the signal M is not brought into a floating state but is maintained at the substrate voltage level by the N-type MOSFET 5 as a switch for short-circuiting the signal line to the substrate side, which is a characteristic of the present invention.

Since the signal M is maintained at the substrate voltage level, the signal M is prevented from maintaining a voltage below the substrate voltage level through the coupling caused by parasitic capacitance generated between the clock C1 and the signal M at the instant when the conduction in the transmission gate 1 ceases.

As described above, when using a P-type substrate, it was kept to a minimum that a PN junction diode between the substrate and a drain with a voltage below the substrate voltage level was subjected to a forward bias, and thus the generation of electrons was suppressed. According to the results of simulation conducted by the present inventors and others, in the dynamic flip flop of the present invention, the number of generated electrons as minority carriers was reduced to $\frac{1}{100000}$ as compared to that in a conventional dynamic flip flop. For instance, in a semiconductor device having a built-in light-receiving element such as a photoelectric conversion device, less electrons as stray carriers contaminated the light-receiving element and the degree of contamination was low. Hence, fixed pattern noise was prevented from being produced.

Embodiment 2

Figure 3:
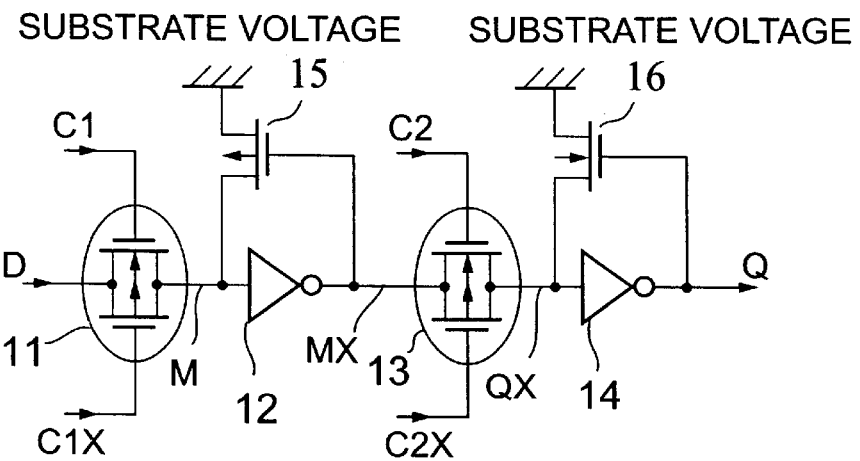
FIG. 3 is a circuit diagram showing a dynamic flip flop according to Embodiment 2 of the present invention.
Figure 4:
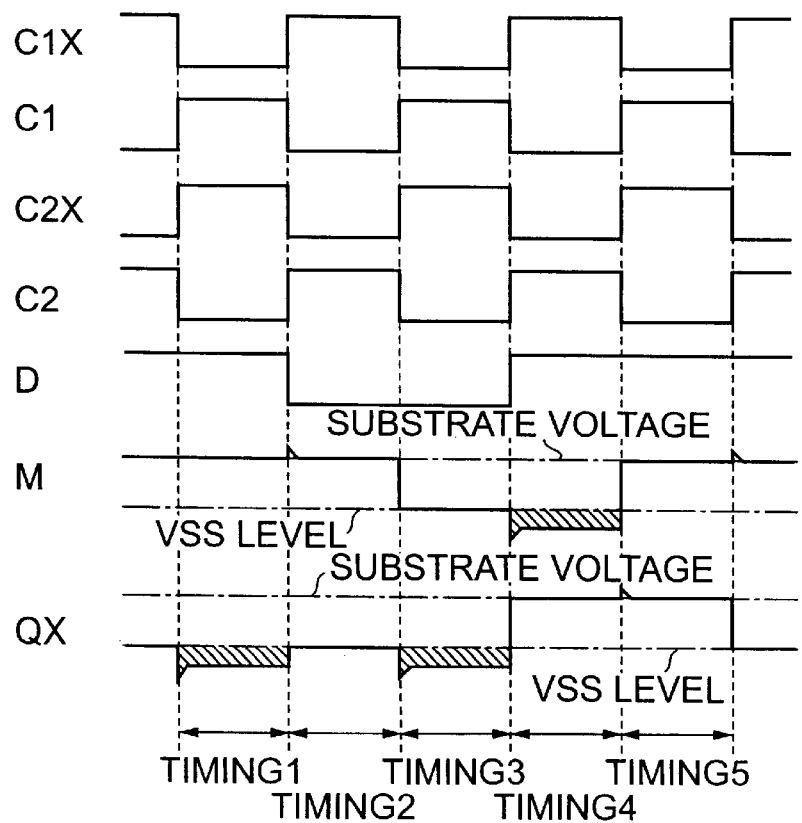
FIG. 4 is a timing chart as to the dynamic flip flop according to Embodiment 2 of the present invention.

FIG. 3 is a circuit diagram showing a dynamic flip flop according to Embodiment 2 of the present invention. FIG. 4 shows an example of timing in respective signal lines in Embodiment 2 of the present invention.

When using an N-type semiconductor substrate, a drain of an N-type MOSFET in a transmission gate 11 is connected to a drain of a P-type MOSFET in the transmission gate 11. A source of the N-type MOSFET in the transmission gate 11 is connected to a source of the P-type MOSFET in the transmission gate 11. Thus, the transmission gate 11 is configured. A clock C1 is input to a gate of the N-type MOSFET in the transmission gate 11. An inverted signal C1X of the clock C1 is input to a gate of the P-type MOSFET in the transmission gate 11. The transmission gate 11 outputs a signal M converted from a signal D input thereinto when the clock C1 reaches a substrate voltage level and the clock C1X reaches a VSS level. An inverter 12, a drain of an N-type MOSFET in a transmission gate 13, and a drain of a P-type MOSFET in the transmission gate 13 are connected to one another. The inverter 12, into which the signal M as an output signal from the transmission gate 11 is input, inverts the signal M to output a signal MX. A source of the N-type MOSFET in the transmission gate 13 and a source of the P-type MOSFET in the transmission gate 13 are connected to each other. Thus, the transmission gate 13 is configured.

A clock C2 is input to a gate of the N-type MOSFET in the transmission gate 13 and an inverted signal C2X of the clock C2 is input to a gate of the P-type MOSFET in the transmission gate 13. The transmission gate 13 outputs a signal QX converted from the signal MX when the clock C2 and the clock C2X reach the substrate voltage level and the VSS level, respectively. In order to eliminate retention of a voltage exceeding the substrate voltage level, which is a characteristic of the present invention, and thus to suppress the generation of minority carriers to a minimum, a P-type MOSFET 15 and a P-type MOSFET 16 are added to a dynamic flip flop of a conventional technique including an inverter 14, into which the signal QX as an output signal from the transmission gate 13 is input, that inverts the signal QX to output a signal Q. In the P-type MOSFET 15, the signal MX as an output signal from the inverter 12 is input to its gate, its source is connected to the substrate voltage level, and its drain is connected to the signal M. In the P-type MOSFET 16, the signal Q as an output signal from the inverter 14 is input to its gate, its source is connected to the substrate voltage level, and its drain is connected to the signal QX. For convenience of the invention, the transmission gate 11 and the transmission gate 13 are described as transmission gates. Instead of the transmission gates, however, P-type MOSFETs or N-type MOSFETs alone may be included.

Furthermore, it is possible to eliminate the retention of a voltage exceeding the substrate voltage level, which is a characteristic of the present invention, even when the clock C1 and the clock C2X are subjected to common connection and the clock C1X and the clock C2 also are subjected to common connection.

FIG. 4 shows an example of timing in the respective signal lines. When the clock C2 falls and the clock C2X rises in timing 5, the conduction in the transmission gate 13 ceases. Until the conduction in the transmission gate 13 ceases, an output at the substrate voltage level from the inverter 12 is supplied to the signal QX. When the conduction in the transmission gate 13 ceases, the signal QX is not brought into a floating state but is maintained at the substrate voltage level by the P-type MOSFET 16 as a switch for short-circuiting the signal line to the substrate side, which is a characteristic of the present invention.

Since the signal QX is maintained at the substrate voltage level, the signal QX is prevented from maintaining a voltage exceeding the substrate voltage level through the coupling caused by parasitic capacitance generated between the clock C2X and the signal QX at the instant when the conduction in the transmission gate 13 ceases. Similarly, when the clock C1 falls and the clock C1X rises in timing 2, the conduction in the transmission gate 11 ceases. Until the conduction in the transmission gate 11 ceases, an input at the substrate voltage level of the signal D is supplied to the signal M. When the conduction in the transmission gate 11 ceases, the signal M is not brought into a floating state but is maintained at the substrate voltage level by the P-type MOSFET 15 as a switch for short-circuiting the signal line to the substrate side, which is a characteristic of the present invention.

Since the signal M is maintained at the substrate voltage level, the signal M is prevented from maintaining a voltage exceeding the substrate voltage level through the coupling caused by parasitic capacitance generated between the clock C1X and the signal M at the instant when the conduction in the transmission gate 11 ceases.

As described above, when using an N-type substrate, it was kept to a minimum that a PN junction diode between the substrate and a drain with a voltage exceeding the substrate voltage level was subjected to a forward bias, and thus the production of holes was suppressed. For instance, in a semiconductor device having a built-in light-receiving element such as a photoelectric conversion device, less holes as stray carriers contaminated the light-receiving element and the degree of contamination was low. Hence, fixed pattern noise was prevented from being produced.

Embodiment 3

Figure 5:
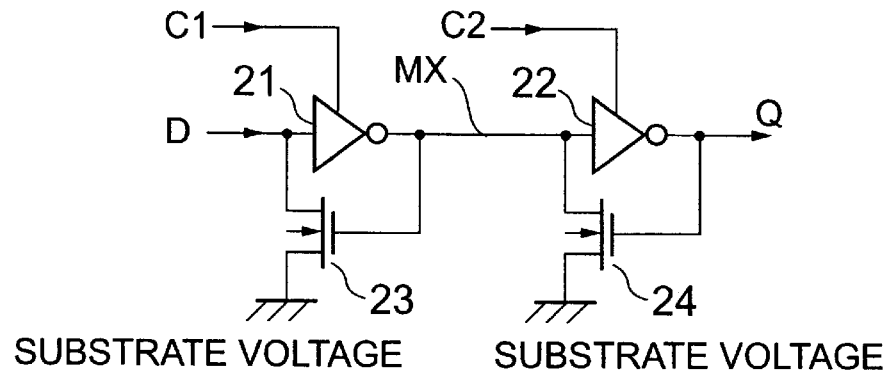
FIG. 5 is a circuit diagram showing a dynamic flip flop according to Embodiment 3 of the present invention.

FIG. 5 is a circuit diagram showing a dynamic flip flop according to Embodiment 3 of the present invention.

When using a P-type semiconductor substrate, an N-type MOSFET 23 and an N-type MOSFET 24 are added to a clocked inverter 21 and a clocked inverter 22 in order to eliminate retention of a voltage below a substrate voltage level, which is a characteristic of the present invention, and thus to suppress the generation of minority carriers to a minimum. The clocked inverter 21 is controlled by a clock C1, functions as an inverter when the clock C1 reaches a VDD level, and inverts a signal D input thereinto to output a signal MX. The clocked inverter 22 is controlled by a clock C2, functions as an inverter when the clock C2 reaches the VDD level, and inverts the signal MX input thereinto to output a signal Q. In the N-type MOSFET 23, the signal MX as an output signal from the clocked inverter 21 is input into its gate, its source is connected to the substrate voltage level, and its drain is connected to the signal D. In the N-type MOSFET 24, the signal Q as an output signal from the clocked inverter 22 is input to its gate, its source is connected to the substrate voltage level, and its drain is connected to the signal MX. With such a circuit configuration, it is possible to eliminate the retention of a voltage below the substrate voltage level with no influence exerted by the clock C1 and the clock C2 as in Embodiment 1.

Embodiment 4

Figure 6:
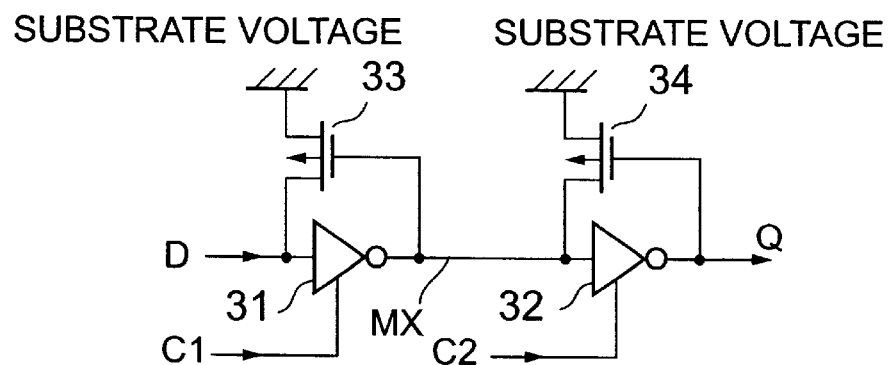
FIG. 6 is a circuit diagram showing a dynamic flip flop according to Embodiment 4 of the present invention.
Figure 7:
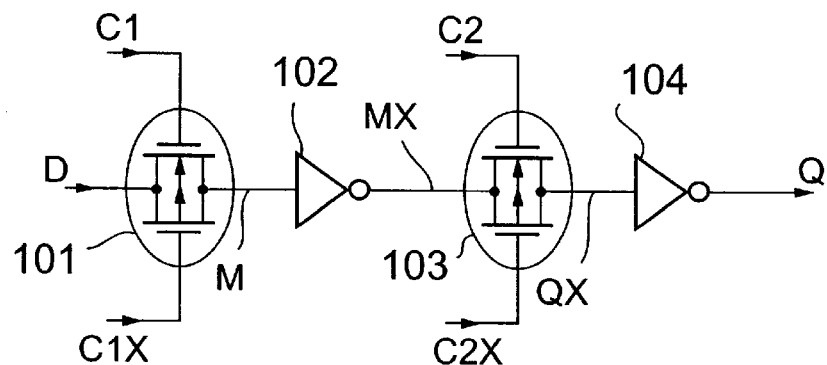
FIG. 7 is a circuit diagram showing a conventional dynamic flip flop.
Figure 8:
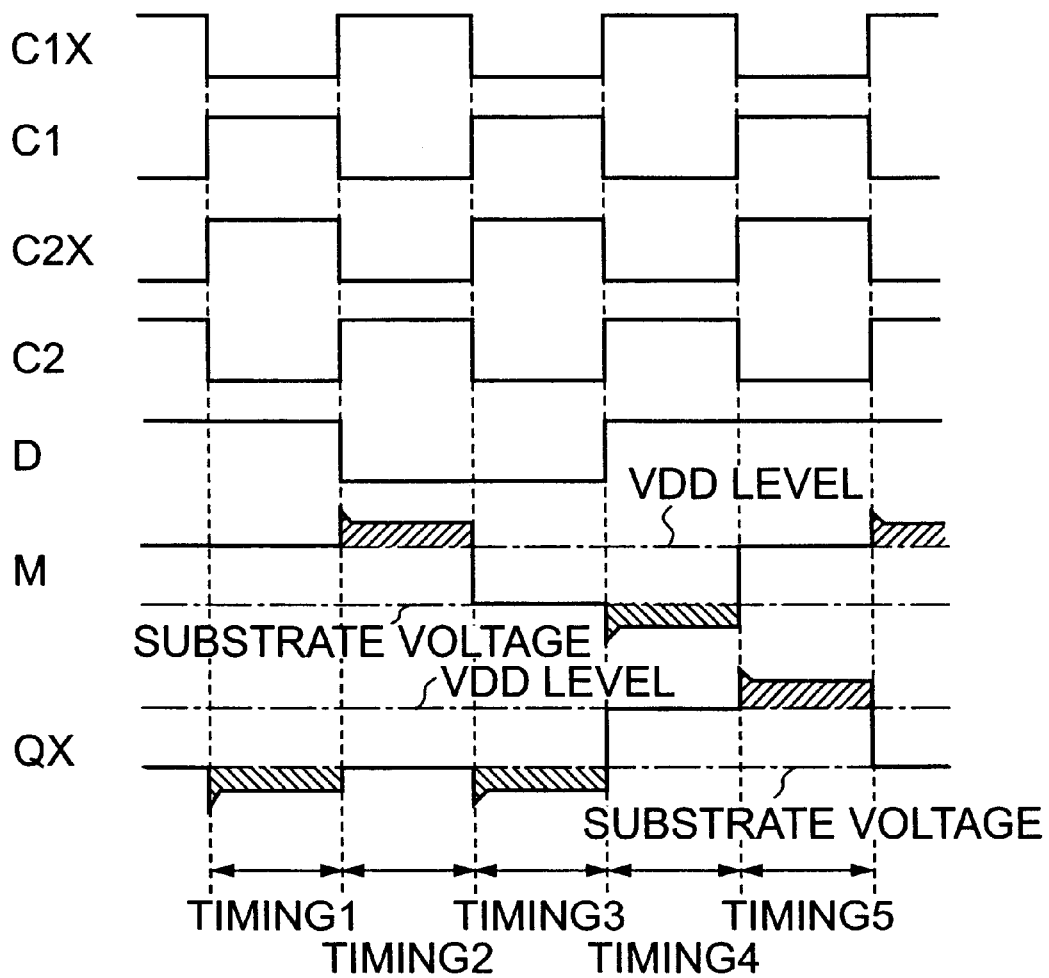
FIG. 8 is a timing chart as to the conventional dynamic flip flop.

FIG. 6 is a circuit diagram showing a dynamic flip flop according to Embodiment 4 of the present invention.

When using an N-type semiconductor substrate, a P-type MOSFET 33 and a P-type MOSFET 34 are added to a clocked inverter 31 and a clocked inverter 32 in order to eliminate retention of a voltage exceeding a substrate voltage level, which is a characteristic of the present invention, and thus to suppress the generation of minority carriers to a minimum. The clocked inverter 31 is controlled by a clock C1, functions as an inverter when the clock C1 reaches a VSS level, and inverts a signal D input thereinto to output a signal MX. The clocked inverter 32 is controlled by a clock C2, functions as an inverter when the clock C2 reaches the VSS level, and inverts the signal MX input thereinto to output a signal Q. In the P-type MOSFET 33, the signal MX as an output signal from the clocked inverter 31 is input to its gate, its source is connected to the substrate voltage level, and its drain is connected to the signal D. In the P-type MOSFET 34, the signal Q as an output signal from the clocked inverter 32 is input to its gate, its source is connected to the substrate voltage level, and its drain is connected to the signal MX. With such a circuit configuration, it is possible to eliminate the retention of a voltage exceeding the substrate voltage level with no influence exerted by the clock C1 and the clock C2 as in Embodiment 2.

The present invention can be implemented in the forms described above and provides an excellent effect as described below. Switches are provided that short-circuit signal lines to be brought into a floating state to the substrate side according to timing of clocks, so that the retention of a voltage below the substrate voltage level can be eliminated in a P-type semiconductor substrate and the retention of a voltage exceeding the substrate voltage level can be eliminated in an N-type semiconductor substrate. Thus, there is provided an effect that the generation of minority carriers can be reduced to a minimum.

The invention maybe embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. In a dynamic flip flop having first and second transmission gates formed in a substrate, the combination comprising: first and second switches controlled by clocks used for driving the transmission gates and being respectively connected to outputs of the first and second transmission gates for short-circuiting the outputs of the first and second transmission gates to a substrate voltage level whenever the respective transmission gates are placed in a non-conductive state, to thereby prevent the outputs of the transmission gates from one of falling below the substrate voltage level or exceeding the substrate voltage level due to a parasitic capacitance.

2. A dynamic shift register having one or more flip flops; wherein the flip flops each comprise a dynamic flip flop according to claim 1.

3. A semiconductor device, comprising a photoelectric conversion device having a dynamic flip flop according to claim 1.

4. A semiconductor device, comprising a photoelectric conversion device having a dynamic shift register according to claim 2.

5. A dynamic flip flop according to claim 1; wherein the first transmission gate comprises a first N-type MOSFET and a first P-type MOSFET, drains of the first N-type MOSFET and the first P-type MOSFET being interconnected and sources of the first N-type MOSFET and the first P-type MOSFET being interconnected, a first clock signal Cl being input to a gate of the first N-type MOSFET, and an inverted signal C1X of the first clock signal C1 being input to a gate of the first P-type MOSFET, an input signal D being input to the first transmission gate, and an output signal M being output by the first transmission gate when the first clock C1 is set at a VDD level and the inverted signal C1X is at the substrate voltage level.

6. A dynamic flip flop according to claim 5; further comprising a first inverter connected to an output of the first transmission gate for inverting the output signal M and outputting an inverted signal MX.

7. A dynamic flip flop according to claim 6; wherein the second transmission gate comprises a second N-type MOSFET and a second P-type MOSFET, drains of the second N-type MOSFET and the second P-type MOSFET being interconnected and sources of the second N-type MOSFET and the second P-type MOSFET being interconnected, a second clock signal C2 being input to a gate of the second N-type MOSFET, and an inverted signal C2X of the second clock signal C2 being input to a gate of the second P-type MOSFET, the second transmission gate for receiving the signal MX as an input signal and outputting a signal QX when the second clock signal C2 is at the VDD level and the inverted signal C2X is at the substrate voltage level.

8. A dynamic flip flop according to claim 7; further comprising a second inverter connected to an output of the second transmission gate for inverting the output signal QX and outputting an inverted signal Q.

9. A dynamic flip flop according to claim 8; wherein the transmission gates are formed in a P-type substrate; and the first switch comprises a third N-type MOSFET having a gate connected to an output of the first inverter, a source tied to the substrate voltage level, and a drain connected to the signal M, so that the output of the first transmission gate does not fall below the substrate voltage level when the first switch is turned on.

10. A dynamic flip flop according to claim 9; wherein the second switch comprises a fourth N-type MOSFET having a gate connected to an output of the second inverter, a source tied to the substrate voltage level, and a drain connected to the signal QX, so that the output of the second transmission gate does not fall below the substrate voltage level when the second switch is turned on.

11. A dynamic shift register having one or more flip flops; wherein the flip flops each comprise a dynamic flip flop according to claim 10.

12. A semiconductor device, comprising a photoelectric conversion device having a dynamic flip flop according to claim 10.

13. A semiconductor device, comprising a photoelectric conversion device having a dynamic shift register according to claim 11.

14. A dynamic flip flop according to claim 8; wherein the transmission gates are formed in an N-type substrate; and the first switch comprises a third P-type MOSFET having a gate connected to an output of the first inverter, a source tied to the substrate voltage level, and a drain connected to the signal M, so that the output of the first transmission gate does not exceed the substrate voltage level when the first switch is turned on.

15. A dynamic flip flop according to claim 14; wherein the second switch comprises a fourth P-type MOSFET having a gate connected to an output of the second inverter, a source tied to the substrate voltage level, and a drain connected to the signal QX, so that the output of the second transmission gate does not exceed the substrate voltage level when the second switch is turned on.

16. A dynamic shift register having one or more flip flops; wherein the flip flops each comprise a dynamic flip flop according to claim 15.

17. A semiconductor device, comprising a photoelectric conversion device having a dynamic flip flop according to claim 15.

18. A semiconductor device, comprising a photoelectric conversion device having a dynamic shift register according to claim 11.

19. A dynamic flip flop according to claim 1; wherein the substrate voltage level is ground potential.

20. A flip flop comprising: a first transmission gate for receiving an input signal, a first clock signal, and an inverted first clock signal and outputting a signal corresponding to the input signal in accordance with the first clock signal and the inverted first clock signal; a first inverter for inverting the output signal of the first transmission gate; a second transmission gate for receiving an output signal of the first inverter, a second clock signal, and an inverted second clock signal and outputting a signal corresponding to the input signal in accordance with the second clock signal and the inverted second clock signal; a second inverter for inverting the output signal of the second transmission gate; a first switch for short-circuiting an output of the first transmission gate to a substrate voltage level whenever the first transmission gate is in a non-conductive state; and a second switch for short-circuiting an output of the second transmission gate to the substrate voltage level whenever the second transmission gate is in a non-conductive state.

21. A flip flop according to claim 20; wherein the first and second transmission gates each comprise an N-type MOSFET and a P-type MOSFET having interconnected drains and interconnected sources, and gate electrodes to which the clock signals are supplied.

22. A flip flop according to claim 20; wherein the transmission gates are formed in a P-type substrate; and the first switch comprises an N-type MOSFET having a gate connected to an output of the first inverter a source tied to the substrate voltage level, and a drain connected to the output of the first transmission gate, so that the output of the first transmission gate does not fall below the substrate voltage level when the first switch is turned on.

23. A dynamic flip flop according to claim 22; wherein the second switch comprises an N-type MOSFET having a gate connected to an output of the second inverter, a source tied to the substrate voltage level, and a drain connected to the output of the second transmission gate, so that the output of the second transmission gate does not fall below the substrate voltage level when the second switch is turned on.

24. A flip flop according to claim 20; wherein the first and second transmission gates are formed in an N-type substrate; and the first switch comprises a third P-type MOSFET having a gate connected to an output of the first inverter, a source tied to the substrate voltage level, and a drain connected to the output of the first transmission gate, so that the output of the first transmission gate does not exceed the substrate voltage level when the first switch is turned on.

25. A dynamic flip flop according to claim 24; wherein the second switch comprises a fourth P-type MOSFET having a gate connected to an output of the second inverter, a source tied to the substrate voltage level, and a drain connected to the output of the second transmission gate, so that the output of the second transmission gate does not exceed the substrate voltage level when the second switch is turned on.

26. A dynamic flip flop according to claim 20; wherein the substrate voltage level is ground potential.

27. An inverting circuit having one or more stages each comprising: an input terminal for supplying an input signal; an inverter connected to the input terminal for inverting the input signal and outputting an inverted signal in accordance with a clock signal; and a switch for short-circuiting the inverter input to a substrate voltage level in accordance with the clock signal to prevent the input of the inverter from one of falling below the substrate voltage level or exceeding the substrate voltage level due to a parasitic capacitance.

28. An inverting circuit according to claim 27; wherein the inverter is formed in a P-type substrate, and the switch short-circuits the input of the inverter to the substrate voltage level to prevent the input of the inverter from falling below the substrate voltage level.

29. An inverting circuit according to claim 27; wherein the inverter is formed in an N-type substrate, and the switch short-circuits the input of the inverter to the substrate voltage level to prevent the input of the inverter from exceeding the substrate voltage level.

* * * * *